(12) United States Patent  
Park

(10) Patent No.: US 8,283,668 B2  
(45) Date of Patent: Oct. 9, 2012

(54) THIN FILM TRANSISTOR, METHOD OF FABRICATING THE SAME, AND ORGANIC LIGHT EMITTING DIODE DISPLAY DEVICE INCLUDING THE SAME

(75) Inventor: Byoung-Keon Park, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 328 days.

(21) Appl. No.: 12/194,730

(22) Filed: Aug. 20, 2008

(65) Prior Publication Data

US 2009/0050893 A1   Feb. 26, 2009

(30) Foreign Application Priority Data

Aug. 23, 2007   (KR) .................. 10-2007-0084934

(51) Int. Cl.  
    *H01L 29/04* (2006.01)
(52) U.S. Cl. ............... 257/59; 257/69; 257/70; 257/72; 257/347; 257/E27.108; 257/E27.109; 257/E27.112
(58) Field of Classification Search .................. 257/69, 257/70, 72, 347, E27.108, E27.109, E27.112  
See application file for complete search history.

(56) References Cited

U.S. PATENT DOCUMENTS

| | | | |
|---|---|---|---|
| 3,465,209 A | 9/1969 | Denning et al. | |
| 5,637,515 A | 6/1997 | Takemura | |
| 6,087,206 A | 7/2000 | Hamada | |
| 6,191,449 B1 | 2/2001 | Shino | |
| 6,380,007 B1 | 4/2002 | Koyama | |
| 6,399,460 B1 | 6/2002 | Yamaguchi et al. | |
| 6,495,857 B2 | 12/2002 | Yamazaki | |
| 6,500,704 B1 | 12/2002 | Hirano et al. | |
| 6,506,669 B1 | 1/2003 | Kuramasu et al. | |
| 6,531,815 B1 | 3/2003 | Okuyama et al. | |
| 6,620,661 B2 | 9/2003 | Maekawa et al. | |
| 6,746,905 B1 | 6/2004 | Fukuda | |

(Continued)

FOREIGN PATENT DOCUMENTS

CN    1388591 A    1/2003

(Continued)

OTHER PUBLICATIONS

Notice of Allowability issued on Sep. 29, 2008 in corresponding Korean Patent Application No. 2007-53314.

(Continued)

*Primary Examiner* — Long Tran  
(74) *Attorney, Agent, or Firm* — H.C. Park & Associates, PLC

(57) ABSTRACT

A thin film transistor (TFT) includes a substrate, a semiconductor layer disposed on the substrate and crystallized using a metal catalyst, a gate insulating layer disposed on the semiconductor layer, a gate electrode disposed on the gate insulating layer, an interlayer insulating layer disposed on the gate electrode, and source and drain electrodes disposed on the interlayer insulating layer and electrically connected to source and drain regions of the semiconductor layer through contact holes exposing predetermined regions of the source and drain regions of the semiconductor layer formed within the gate insulating layer and the interlayer insulating layer. A metal silicide including a metal that is different from the metal catalyst is present within a region of the semiconductor layer under the contact hole from the surface of the semiconductor layer to a predetermined depth.

26 Claims, 13 Drawing Sheets

U.S. PATENT DOCUMENTS

| | | | |
|---|---|---|---|
| 6,893,503 | B1 | 5/2005 | Ohnuma et al. |
| 7,045,444 | B2 | 5/2006 | Yamazaki et al. |
| 7,098,089 | B2 | 8/2006 | Paik |
| 7,130,002 | B2 | 10/2006 | Seo et al. |
| 7,202,143 | B1 | 4/2007 | Naseem et al. |
| 2001/0025992 | A1 | 10/2001 | Nakajima et al. |
| 2001/0041397 | A1 | 11/2001 | Fukushima |
| 2002/0013114 | A1 | 1/2002 | Ohtani et al. |
| 2002/0016029 | A1 | 2/2002 | Kawakita et al. |
| 2002/0096681 | A1 | 7/2002 | Yamazaki et al. |
| 2002/0182828 | A1 | 12/2002 | Asami et al. |
| 2003/0013279 | A1 | 1/2003 | Jang et al. |
| 2003/0030108 | A1 | 2/2003 | Morosawa |
| 2003/0148561 | A1 | 8/2003 | Nakajima |
| 2003/0155572 | A1 | 8/2003 | Han et al. |
| 2003/0201442 | A1 | 10/2003 | Makita |
| 2004/0046171 | A1 | 3/2004 | Lee et al. |
| 2004/0089878 | A1 | 5/2004 | Takehashi et al. |
| 2004/0135180 | A1 | 7/2004 | Makita |
| 2004/0164300 | A1 | 8/2004 | Yamazaki et al. |
| 2004/0206958 | A1 | 10/2004 | Yamazaki et al. |
| 2005/0035352 | A1 | 2/2005 | Onizuka |
| 2005/0105037 | A1* | 5/2005 | Kim et al. ............ 349/151 |
| 2005/0110022 | A1 | 5/2005 | Kim et al. |
| 2005/0133867 | A1 | 6/2005 | Ohtani et al. |
| 2005/0140841 | A1 | 6/2005 | Yang et al. |
| 2005/0170573 | A1 | 8/2005 | Makita et al. |
| 2005/0285111 | A1 | 12/2005 | Tsuboi |
| 2006/0033107 | A1 | 2/2006 | Lee et al. |
| 2006/0040438 | A1 | 2/2006 | Lu et al. |
| 2006/0115948 | A1 | 6/2006 | Tokunaga |
| 2006/0263957 | A1 | 11/2006 | Wong et al. |
| 2007/0007529 | A1 | 1/2007 | Takemura et al. |
| 2007/0181890 | A1 | 8/2007 | Yamazaki et al. |
| 2007/0207577 | A1 | 9/2007 | Oyu |
| 2007/0228420 | A1 | 10/2007 | Takano et al. |
| 2008/0001228 | A1 | 1/2008 | Shionoiri et al. |
| 2008/0217620 | A1 | 9/2008 | Park et al. |
| 2008/0246027 | A1* | 10/2008 | Kim ............................ 257/40 |
| 2009/0008642 | A1 | 1/2009 | Kim et al. |

FOREIGN PATENT DOCUMENTS

| | | |
|---|---|---|
| CN | 1638147 | 7/2005 |
| EP | 0 225 821 | 6/1987 |
| EP | 0 816 903 A1 | 1/1998 |
| EP | 1 052 700 | 11/2000 |
| EP | 1 508 921 A2 | 2/2005 |
| EP | 1 524 702 A2 | 4/2005 |
| EP | 1 858 068 | 11/2007 |
| EP | 2 003 695 | 12/2008 |
| EP | 2 009 680 | 12/2008 |
| EP | 2003695 | 12/2008 |
| EP | 2 028 687 | 2/2009 |
| EP | 2 107 613 | 10/2009 |
| JP | 05-047791 | 2/1993 |
| JP | 07-176753 | 7/1995 |
| JP | 07-326764 | 12/1995 |
| JP | 08-255907 | 10/1996 |
| JP | 10-012882 | 1/1998 |
| JP | 10-223533 | 8/1998 |
| JP | 11-008393 | 1/1999 |
| JP | 11-111992 | 4/1999 |
| JP | 11-261075 | 9/1999 |
| JP | 2000-036598 | 2/2000 |
| JP | 2000-114527 | 4/2000 |
| JP | 2000-252474 | 9/2000 |
| JP | 2001-077364 | 3/2001 |
| JP | 2001-319878 | 11/2001 |
| JP | 2002-093745 | 3/2002 |
| JP | 2003-075870 | 3/2003 |
| JP | 2003-100633 | 4/2003 |
| JP | 2003-188098 | 7/2003 |
| JP | 2003-203924 | 7/2003 |
| JP | 2003-298059 | 10/2003 |
| JP | 2003-303831 | 10/2003 |
| JP | 2003-318194 | 11/2003 |
| JP | 2004-022845 | 1/2004 |
| JP | 2005-181973 | 7/2005 |
| JP | 2005-197526 | 7/2005 |
| JP | 2006-49823 | 2/2006 |
| JP | 2006-066860 | 3/2006 |
| JP | 2006-345003 | 12/2006 |
| KR | 1999-75412 | 10/1999 |
| KR | 1999-88504 | 12/1999 |
| KR | 2000-52006 | 8/2000 |
| KR | 2003-3043 | 1/2003 |
| KR | 2003-57656 | 7/2003 |
| KR | 2003-69779 | 8/2003 |
| KR | 2003-73075 | 9/2003 |
| KR | 2003-73076 | 9/2003 |
| KR | 2003-84738 | 11/2003 |
| KR | 2004-82168 | 9/2004 |
| KR | 10-482462 | 4/2005 |
| KR | 2005-36625 | 4/2005 |
| KR | 10-2005-0049684 | 5/2005 |
| KR | 10-2005-0049692 | 5/2005 |
| KR | 2005-41836 | 5/2005 |
| KR | 10-509529 | 8/2005 |
| KR | 2005-106244 | 11/2005 |
| KR | 2006-99694 | 9/2006 |
| KR | 10-2007-0024016 | 3/2007 |
| KR | 2008-0082827 | 9/2008 |

OTHER PUBLICATIONS

European Search Report issued Nov. 3, 2009 in corresponding European Patent Application No. 09165373.3.

Search Report issued by European Patent Office in European Patent Application No. 08157167.1 on Nov. 28, 2008.

Hu, Chen-Ming, et al. "Gettering of Nickel within Ni-Metal Induced Lateral Crystallization Polycrystalline Silicon Film through the Contact Holes", *Japanese Journal of Applied Physics*. Vo. 46, No. 48. 2007. pp. L1188-L1190.

Ng, K. K. *Complete Guide to Semiconductor Devices*. Second Edition. Wiley. New York. 2002. pp. 694-695.

European Search Report issued on Dec. 11, 2008 in corresponding European Application No. 08162758.0-1528.

Korean Notice of Allowability issued on Dec. 26 , 2008 in corresponding Korean Application No. 2007-84934.

Korean Notice of Allowability issued on Dec. 26, 2008 in corresponding Korean Application No. 2007-84412.

U.S. Office Action dated Mar. 8, 2010, issued in U.S. Appl. No. 12/194,739.

Abstract of KR 2000-41547.

Office Action issued by Korean Intellectual Property Office in Korean Patent Application No. 10-2007-0053314 on Mar. 25, 2008.

Myers, S.M., et al. "Mechanisms of Transition-metal Gettering in Silicon", *Journal of Applied Physics*, V. 88, No. 7 (Oct. 1, 2000), pp. 3795-3819.

Benton, J.L., et al. "Behavior of Molybdenum in Silicon Evaluated for Integrated Circuit Processing", *Journal of Electrochemical Society*, V. 146, No. 5, (1999), pp. 1929-1933.

Benton, J.L. et al. "Behavior of Molybdenum in Silicon Evaluated for Integrated Circuit Processing". *Journal of the Electrochemical Society*. vol. 146, No. 5. pp. 1929-1933. 1999.

Myers, S.M., et al. "Mechanisms of Transition-metal Gettering in Silicon". *Journal of Applied Physics*. vol. 88, No. 7. pp. 3795-3819. 2000.

Japanese Journal of Applied Physics; vol. 28, No. 7, pp. 1272-1273; 1989; XP009121147.

European Office Action issued on Aug. 11, 2009 in corresponding European Patent Application No. 08 157 16.1.

Fariborz Assaderaghi et al.: "Dynamic Threshold-Voltage MOSFET (DTMOS) for Ultra-Low Voltage VLSI" IEEE Transactions on Electron Devices, IEEE Service Center, Piscataway, NJ, US, vol. 44, No. 3, Mar. 1, 1997, XP011016082.

Office Action issued Aug. 28, 2009, in corresponding Chinese Patent Application No. 200810214019.

European Search Report issued Sep. 2, 2009 in corresponding European Application No. 09156279).

European Partial Search Report issued Sep. 4, 2009 in corresponding European Patent Application No. 09157829.

US Office Action dated Nov. 26, 2010, issued in corresponding U.S. Appl. No. 12/130,340.
US Office Action dated Dec. 23, 2010, issued in corresponding U.S. Appl. No. 12/194,739.
Jones, et al., "Diffusivity of impurities in polysilicon", Feb. 21, 2007, XP009150765.
Final Office Action of U.S. Appl. No. 12/194,739 issued on Jun. 9, 2011.
Non-Final Office Action dated Jun. 24, 2011 in U.S. Appl. No. 12/409,085.
Non-Final Office Action issued on Sep. 21, 2011 in co-pending U.S. Appl. No. 12/405,466.
Non-Final Office Action issued on Sep. 30, 2011 in co-pending U.S. Appl. No. 12/502,413.
Final Office Action of U.S. Appl. No. 12/130,340 issued on May 12, 2011.
Non-Final Office Action issued on Oct. 7, 2011 in co-pending U.S. Appl. No. 12/130,340.
Notice of Allowance issued on Oct. 17, 2011 in co-pending U.S. Appl. No. 12/409,085.
Non-Final Office Action of U.S. Appl. No. 12/194,739 dated on Jan. 20, 2012.
Final Office Action of U.S. Appl. No. 12/502,413 dated, Feb. 16, 2012.
Final Office Action of U.S. Appl. No. 12/130,340 dated Mar. 8, 2012.
Final Office Action of U.S. Appl. No. 12/405,466 dated Apr. 5, 2012.
Final Office Action of U.S. Appl. No. 12/194,739 dated Jul. 6, 2012.
Notice of Allowance issued for related U.S. Appl. No. 12/405,466 dated Aug. 8, 2012.

* cited by examiner

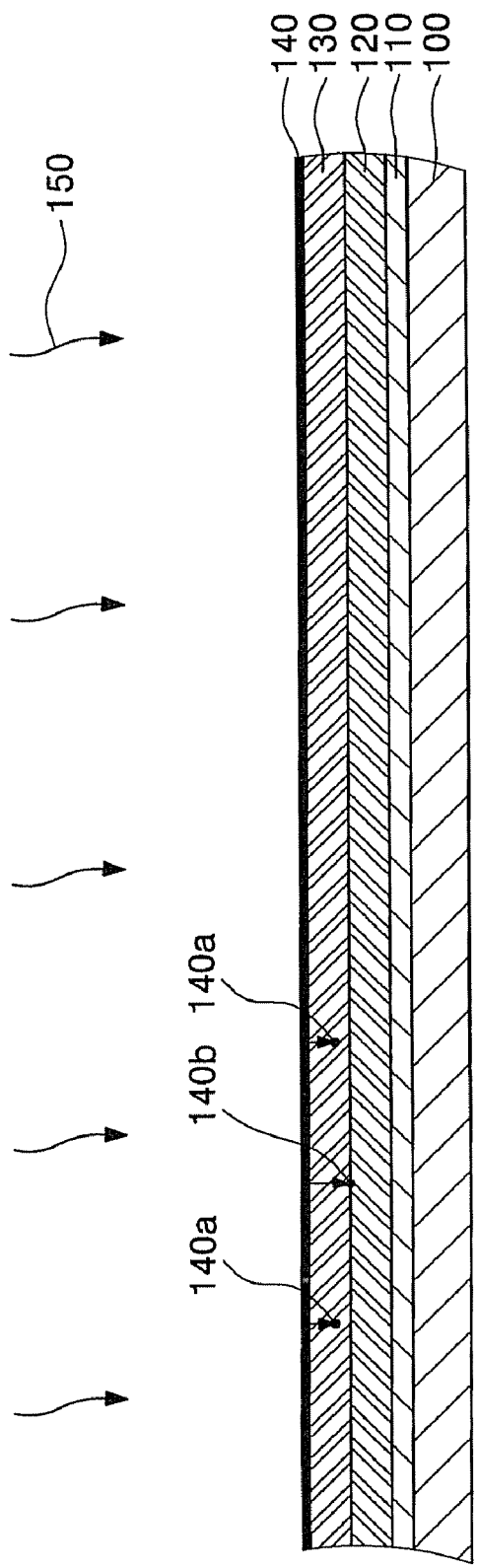
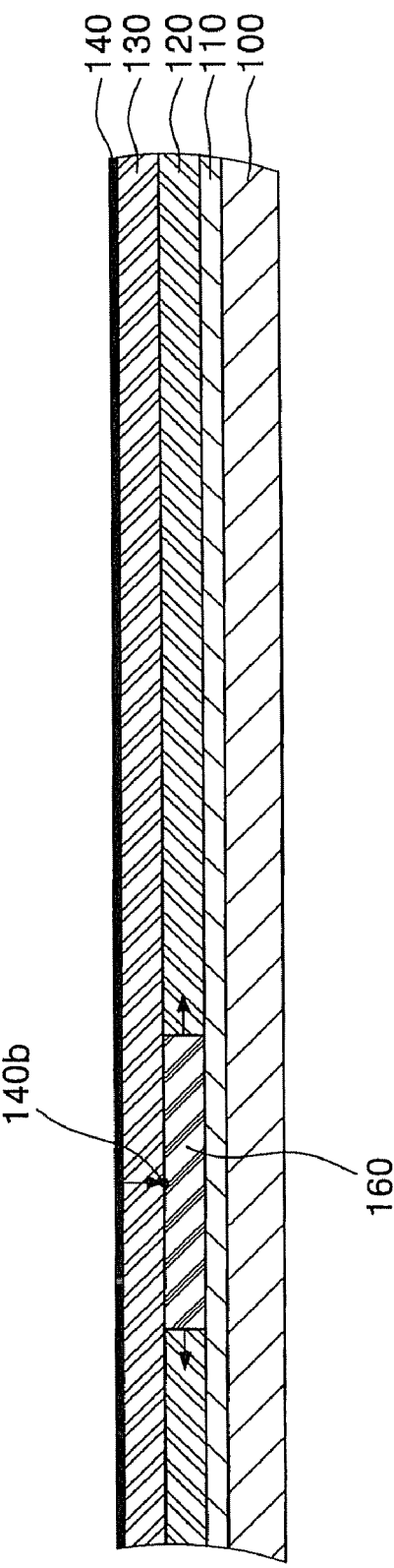

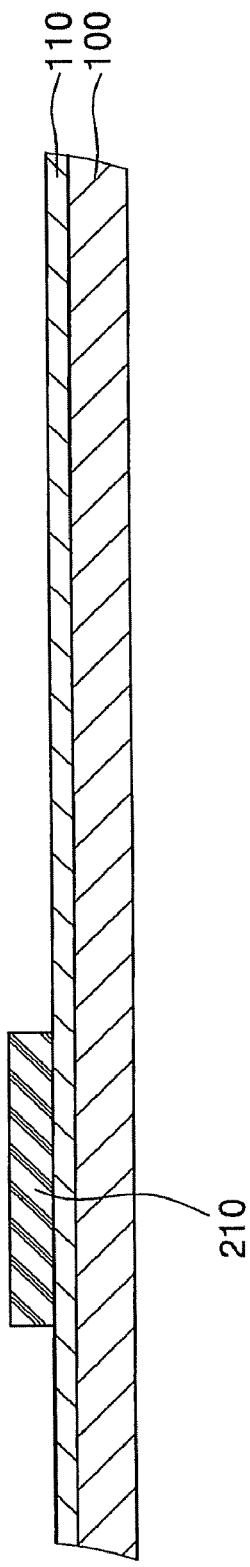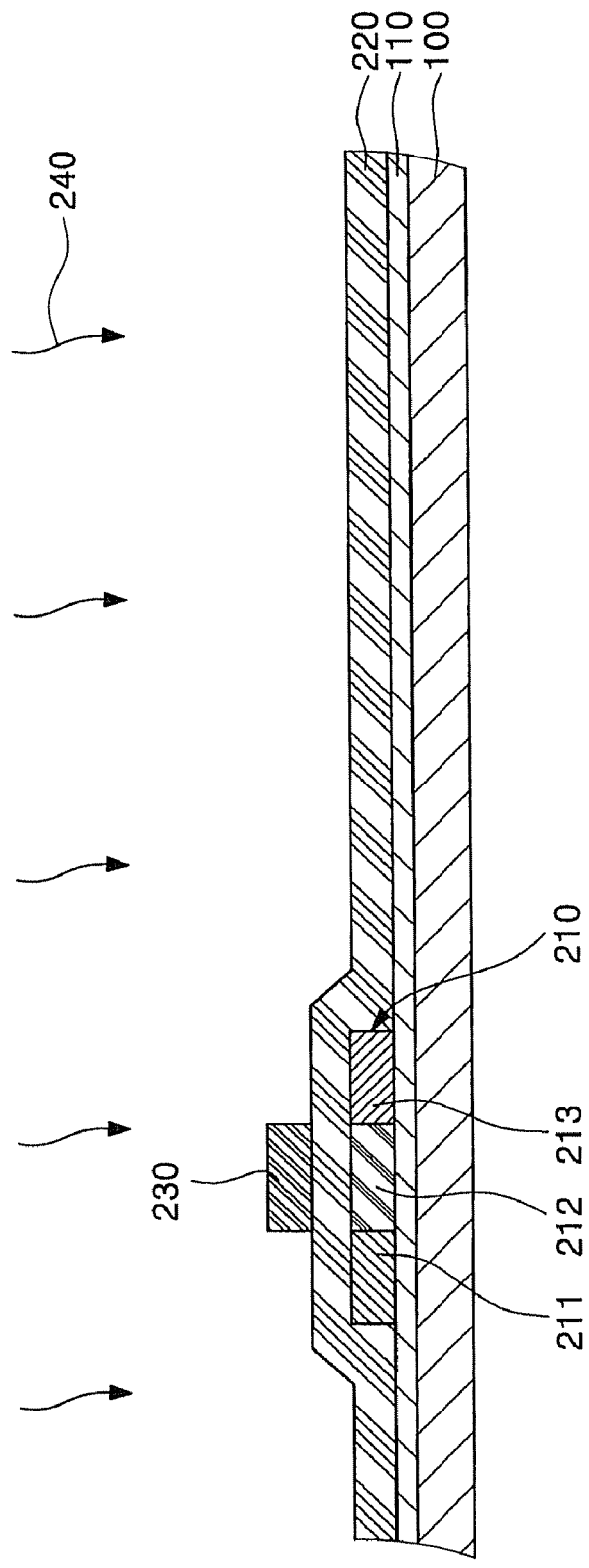

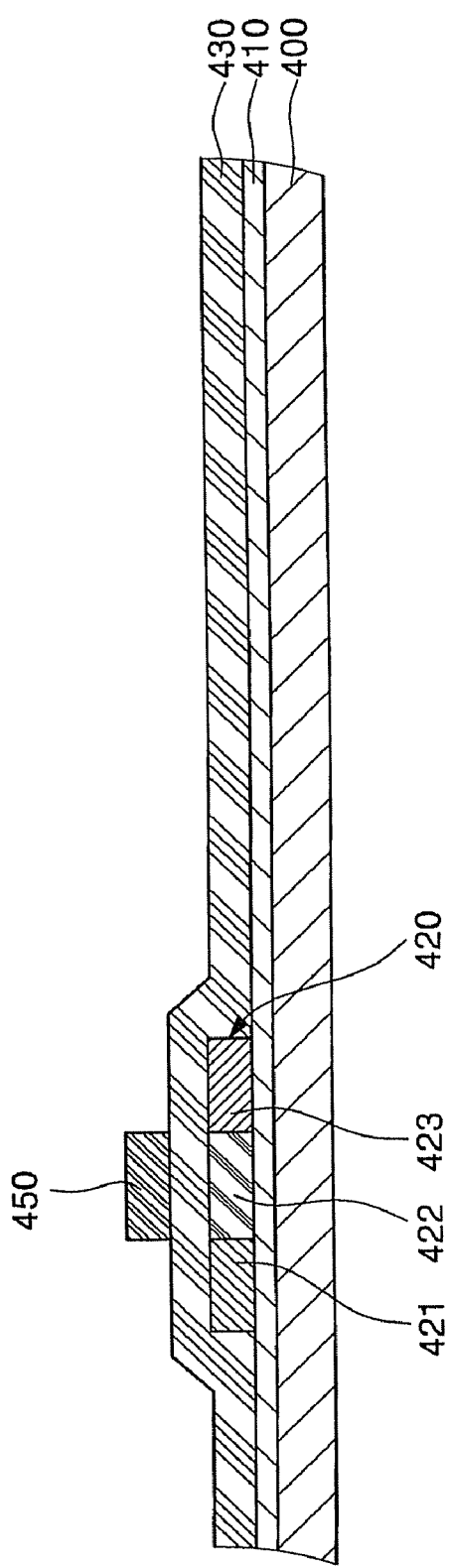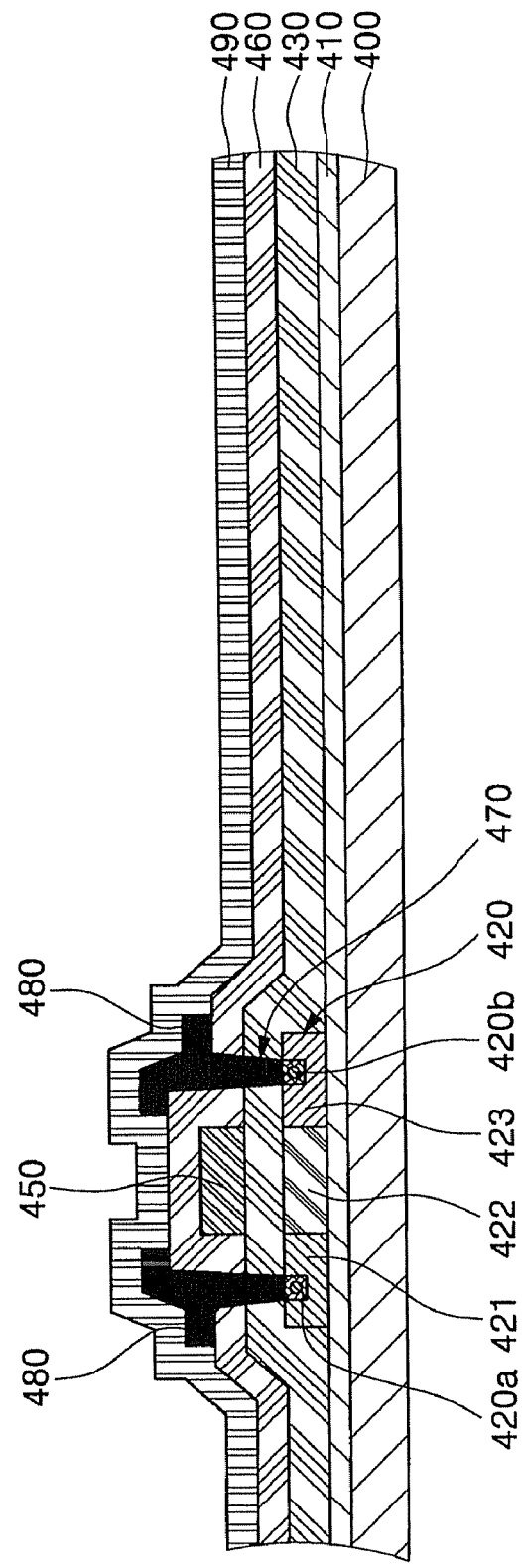

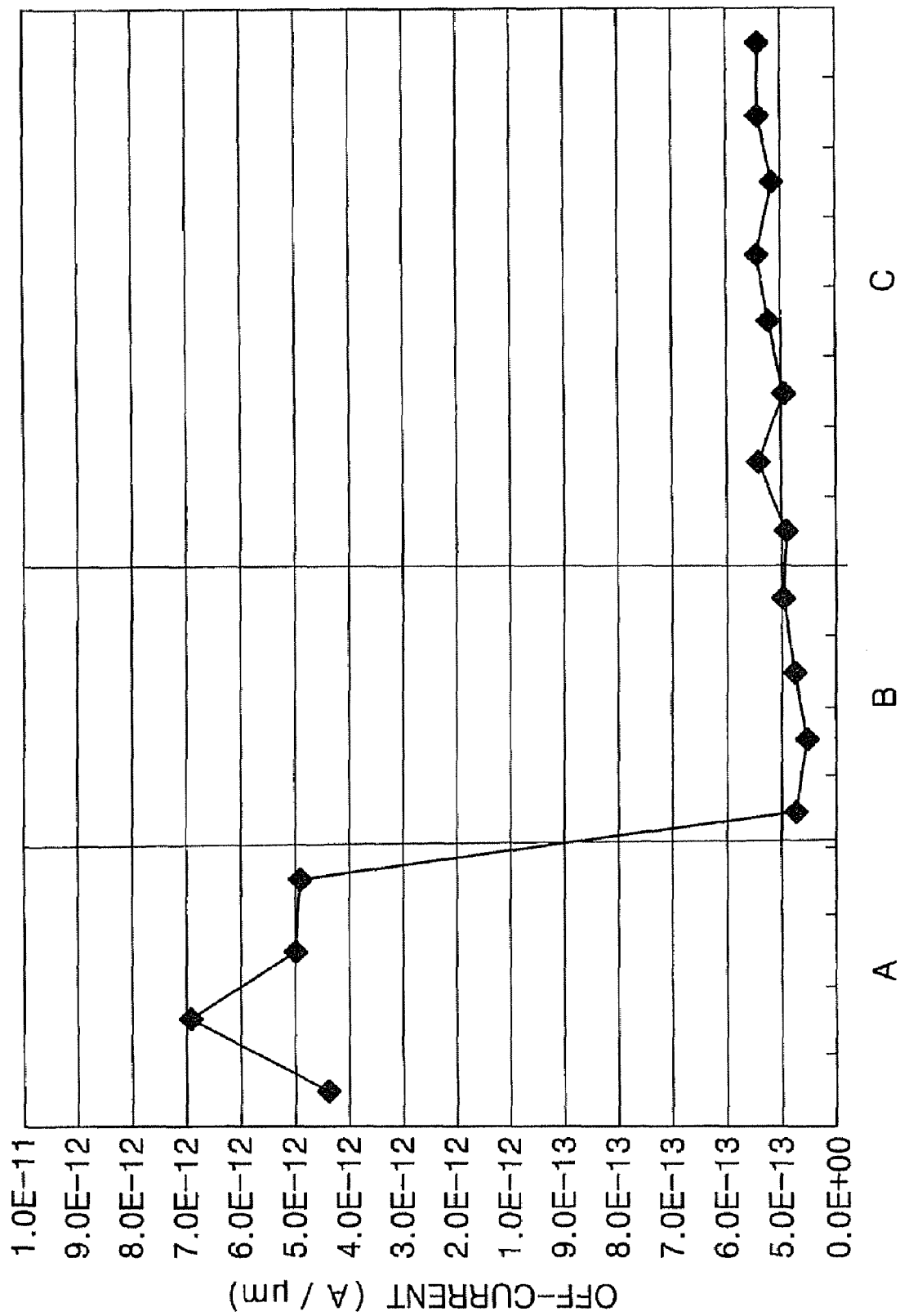

THIN FILM TRANSISTOR, METHOD OF FABRICATING THE SAME, AND ORGANIC LIGHT EMITTING DIODE DISPLAY DEVICE INCLUDING THE SAME

CROSS-REFERENCE TO RELATED APPLICATION

This application claims the benefit of Korean Patent Application No. 2007-84934, filed Aug. 23, 2007, the disclosure of which is hereby incorporated herein by reference in its entirety.

BACKGROUND OF THE INVENTION

1. Field of the Invention

Aspects of the present invention relates to a thin film transistor (TFT), a method of fabricating the same, and an organic light emitting diode (OLED) display device having the same. More particularly, aspects of the present invention relate to a TFT having good electrical characteristics in which metal catalysts remaining in a channel region of a semiconductor layer crystallized using the metal catalysts are gettered to reduce the amount of the metal catalysts remaining in the semiconductor layer, a method of fabricating the same, and an OLED display device having the same.

2. Description of the Related Art

In general, a polycrystalline silicon layer can be advantageously applied to high field-effect mobility and high-speed operation circuits and adapted for complementary metal oxide semiconductor (CMOS) circuits. Polycrystalline silicon layers are widely used as semiconductor layers for TFTs. TFTs using a polycrystalline silicon layer are typically used as an active element of an active matrix liquid crystal display (AMLCD) and a switching element and a driving element of an OLED.

Methods of crystallizing amorphous silicon into polycrystalline silicon include a solid phase crystallization method, an excimer laser crystallization method, a metal induced crystallization method, and a metal induced lateral crystallization method. In the solid phase crystallization method, an amorphous silicon layer is annealed for several hours to tens of hours at a temperature of about 700° C. or less, which is the deformation temperature of glass that is used as the substrate of the display device in which the TFT is used. In the excimer laser crystallization method, local heating is carried out by irradiating an excimer laser onto an amorphous silicon layer for a very short time for crystallization. In the metal induced crystallization method, a phenomenon that the phase change from an amorphous silicon layer into a polycrystalline silicon layer is induced by metal such as nickel, palladium, aurum or aluminum by contacting the metal with the amorphous silicon layer or implanting the metal into the amorphous silicon layer is used. In the metal induced lateral crystallization method sequential crystallization of an amorphous silicon layer is induced while silicide generated by the reaction between metal and silicon continues to propagate laterally.

However, the solid phase crystallization method requires not only a long process time but a long annealing time at a high temperature so that the substrate is disadvantageously apt to be deformed. The excimer laser crystallization method requires a costly laser apparatus and causes protrusions on the polycrystallized surface, providing an inferior interface property between a semiconductor layer and a gate insulating layer. The metal induced crystallization method or the metal induced lateral crystallization method causes a large amount of metal catalysts to remain in the polycrystallized silicon layer so that the leakage current of the semiconductor layer of the TFT increases.

Currently, in the method of crystallizing an amorphous silicon layer using metal crystallization can be advantageously performed for a short time at a lower temperature than in the solid phase crystallization method. Therefore, much research has been conducted on metal induced crystallization methods. Crystallization method using metal include a metal induced crystallization (MIC) method, a metal induced lateral crystallization (MILC) method, and a super grain silicon (SGS) crystallization method. However, in methods using a metal catalyst, device characteristics of the TFT may be deteriorated because of contamination resulting from the metal catalyst.

Accordingly, in a crystallization method using a metal catalyst, a gettering process is performed after the amorphous silicon layer is crystallized in order to remove the metal catalysts. A general gettering process is performed using impurities such as phosphorous or noble gas or using a method of forming an amorphous silicon layer on a polycrystalline silicon layer. However, even in the methods as described above, the metal catalysts within the polycrystalline silicon layer may not be significantly removed so that the leakage current may remain high.

SUMMARY OF THE INVENTION

Aspects of the present invention provide a TFT having good electrical characteristics by gettering metal catalysts remaining in a channel region of a semiconductor layer crystallized using the metal catalysts to reduce the amount of the metal catalysts remaining in the semiconductor layer, a method of fabricating the same, and an OLED display device having the same.

According to an embodiment of the present invention, a TFT includes: a substrate; a semiconductor layer disposed on the substrate and crystallized using a metal catalyst; a gate insulating layer disposed on the semiconductor layer; a gate electrode disposed on the gate insulating layer; an interlayer insulating layer disposed on the gate electrode; and source and drain electrodes disposed on the interlayer insulating layer and electrically connected to source and drain regions, respectively, of the semiconductor layer through contact holes exposing predetermined regions of the source and drain regions of the semiconductor layer formed within the gate insulating layer and the interlayer insulating layer. A metal silicide comprising a metal that is different from the metal catalyst is present within a region of the semiconductor layer under each contact hole from the surface of the semiconductor layer to a predetermined depth.

According to another embodiment of the present invention, a method of fabricating a TFT includes: preparing a substrate; forming an amorphous silicon layer on the substrate; crystallizing the amorphous silicon layer into a polycrystalline silicon layer using a metal catalyst; patterning the polycrystalline silicon layer to form a semiconductor layer; forming a gate insulating layer on the semiconductor layer; forming a gate electrode on the gate insulating layer, forming an interlayer insulating layer over the entire surface of the substrate including the gate electrode; etching the gate insulating layer and the interlayer insulating layer to form contact holes exposing source and drain regions of the semiconductor layer; forming a metal layer, a metal silicide layer, or a double layer thereof on the interlayer insulating layer in which the contact holes are formed; and annealing the substrate to getter the metal catalysts present in a channel region of the semiconductor layer into regions of the semiconductor layer in contact with the metal layer, the metal silicide layer, or the double layer thereof.

According to another embodiment of the present invention, a method of manufacturing a thin film transistor, comprises: crystallizing an amorphous silicon layer into a polycrystalline silicon layer using a metal catalyst; patterning the polycrystalline silicon layer to form a semiconductor layer; forming at least one insulating layer on the semiconductor layer; etching the at least one insulating layer to form contact holes exposing source and drain regions of the semiconductor layer; forming a metal layer, a metal silicide layer, or a double layer thereof on the at least one insulating layer in which the contact holes are formed; and annealing the substrate to getter the metal catalyst present in a channel region of the semiconductor layer into regions of the semiconductor layer in contact with the metal layer, the metal silicide layer, or the double layer thereof.

According to still another embodiment of the present invention, an OLED display device includes: a substrate; a semiconductor layer disposed on the substrate and crystallized using a metal catalyst; a gate insulating layer disposed on the semiconductor layer; a gate electrode disposed on the gate insulating layer; an interlayer insulating layer disposed on the gate electrode; source and drain electrodes disposed on the interlayer insulating layer and electrically connected to source and drain regions, respectively, of the semiconductor layer through contact holes exposing predetermined regions of the source and drain regions of the semiconductor layer formed within the gate insulating layer and the interlayer insulating layer; a first electrode electrically connected to the source and drain electrodes; an organic layer including an emitting layer disposed on the first electrode; and a second electrode disposed on the organic layer. A metal silicide comprising a metal that is different from the metal catalyst is present within a region of the semiconductor layer under the contact hole from the surface of the semiconductor layer to a predetermined depth.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 1A to 1D are cross-sectional views illustrating a crystallization process of an amorphous silicon layer to form a polycrystalline silicon layer;

FIGS. 2A to 2E are cross-sectional views illustrating a process of fabricating a TFT according to an embodiment of the present invention;

FIGS. 4A to 4C are cross-sectional views illustrating a process of fabricating a TFT according to another embodiment of the present invention;

FIG. 5 is a graph in which the off-current per unit width of the semiconductor layer of a TFT formed by a conventional gettering method using phosphorous doping is compared with the off-current per unit width of the semiconductor layer of TFTs according to embodiments of the present invention.

DETAILED DESCRIPTION OF THE EMBODIMENTS

Figure 1A:
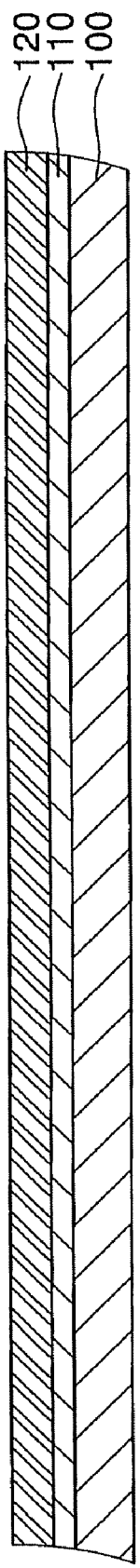

Reference will now be made in detail to the present embodiments of the present invention, examples of which are illustrated in the accompanying drawings, wherein like reference numerals refer to the like elements throughout. The embodiments are described below in order to explain the present invention by referring to the figures. Herein, it is to be understood that where is stated herein that one layer is "formed on" or "disposed on" a second layer, the first layer may be formed or disposed directly on the second layer or there may be intervening layers between the first layer and the second layer. Further, as used herein, the term "formed on" is used with the same meaning as "located on" or "disposed on" and is not meant to be limiting regarding any particular fabrication process.

FIGS. 1A to 1D are cross-sectional views illustrating a crystallization process according to an embodiment of the present invention.

A buffer layer 110 is first formed on a substrate 100 such as glass or plastic, as shown in FIG. 1A. The buffer layer 110 is formed of a single layer or a multiple layer of an insulating material such as a silicon oxide layer or a silicon nitride layer using a chemical vapor deposition (CVD) method or a physical vapor deposition (PVD) method. The buffer layer 110 acts to prevent diffusion of moisture or impurities generated from the substrate 100 and/or acts to facilitate crystallization of an amorphous silicon layer by adjusting the heat transfer rate at the time of crystallization.

An amorphous silicon layer 120 is then formed on the buffer layer 110. The amorphous silicon layer 120 may be formed by a CVD method or a PVD method. In addition, a dehydrogenation process to the hydrogen concentration may be performed at the same time as or after the amorphous silicon layer 120 is formed.

The amorphous silicon layer 120 is then crystallized into a polycrystalline silicon layer. According to aspects of the present invention, a crystallization method using a metal catalyst such as MIC, MILC, or SGS is employed to crystallize the amorphous silicon layer into the polycrystalline silicon layer.

The MIC method uses a phenomenon that the phase change from an amorphous silicon layer into a polycrystalline silicon layer is induced by metal such as nickel (Ni), palladium (Pd), or aluminum (Al) by contacting the metal with the amorphous silicon layer or implanting the metal into the amorphous silicon layer. In the MILC method, an amorphous silicon layer is crystallized into a polycrystalline silicon layer by inducing sequential crystallization of the amorphous silicon layer while a silicide generated by the reaction between a metal catalyst and silicon continues to propagate laterally.

In the SGS crystallization method, the size of the crystal grain is adjusted to be in a range of several μm to several hundreds of μm by adjusting the concentration of the metal catalyst diffusing into an amorphous silicon layer to be in a low concentration. For example, to adjust the concentration of the metal catalyst diffusing into the amorphous silicon layer to be in a low concentration, a capping layer may be formed on the amorphous silicon layer, a metal catalyst layer may be formed on the capping layer and then annealed to diffuse the metal catalysts. In this method, the capping layer controls the diffusion rate of the metal catalyst. Alternatively, the concentration of the metal catalyst can be controlled by forming the metal catalyst layer at a low concentration without forming the capping layer.

According to an aspect of the present invention, the SGS method may used to control the concentration of the metal catalyst diffusing into the amorphous silicon layer at a low concentration by forming the capping layer, which will be described below.

Figure 1B:
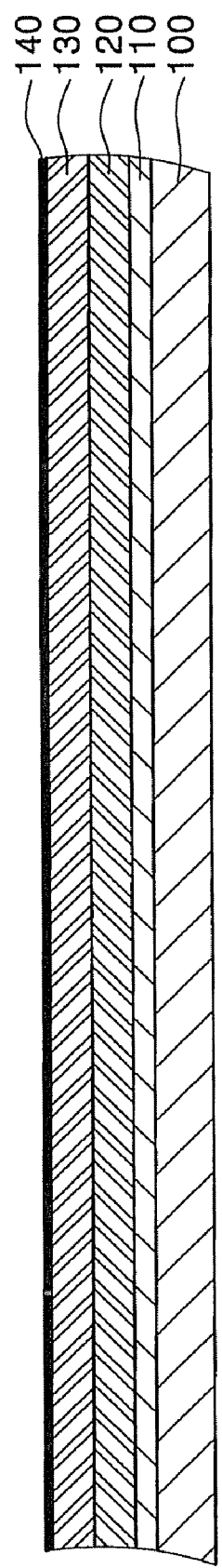

FIG. 1B is a cross-sectional view illustrating a process of forming a capping layer and a metal catalyst layer on the amorphous silicon layer.

Referring to FIG. 1B, a capping layer 130 is formed on the amorphous silicon layer 120. The capping layer 130 may be formed of silicon nitride, which enables the metal catalyst formed subsequently process to be diffused during annealing. Alternatively, the capping layer 130 may be formed as a double layer of silicon nitride and silicon oxide. The capping layer 130 may be formed by a method such as CVD or PVD to have a thickness of 1 to 2000 Å. When the thickness of the capping layer 130 is smaller than 1 Å, it is difficult for the capping layer 130 to suppress the amount of the metal catalyst to be diffused. When the thickness of the capping layer 130 is greater than 2000 Å, the amount of the metal catalyst to be diffused into the amorphous silicon layer 120 is so small that the amorphous silicon layer 120 cannot be crystallized into a polycrystalline silicon layer.

The metal catalyst is then deposited on the capping layer 130 to form a metal catalyst layer 140. At this time, any one selected from the group consisting of Ni, Pd, Ag, Au, Al, Sn, Sb, Cu, Tr, and Cd may be used as the metal catalyst. As a specific, non-limiting example, the metal catalyst may be Ni. The metal catalyst layer 140 is formed on the capping layer 130 at a surface density of $10^{11}$ to $10^{15}$ atoms/cm$^2$. When the metal catalyst has a surface density less than $10^{11}$ atoms/cm$^2$, the number of seeds, i.e., crystallization nuclei, is small so that the amorphous silicon layer cannot be crystallized into the polycrystalline silicon layer by the SGS method. When the metal catalyst has a surface density greater than $10^{15}$ atoms/cm$^2$, the amount of the metal catalyst that diffuses into the amorphous silicon layer is large so that the crystal grain of the polycrystalline silicon layer becomes smaller and the remaining amount of the metal catalysts increases enough to cause characteristics of the semiconductor layer formed by patterning the polycrystalline silicon layer to deteriorate.

FIG. 1C is a cross-sectional view illustrating a process of annealing the substrate to diffuse the metal catalyst toward an interface of the amorphous silicon layer through the capping layer.

Referring to FIG. 1C, the substrate 100 in which the buffer layer 110, the amorphous silicon layer 120, the capping layer 130, and the metal catalyst layer 140 are formed is annealed (process 150) to move some of the metal catalyst of the metal catalyst layer 140 toward the surface of the amorphous silicon layer 120. That is, only a small amount of the metal catalyst 140b among the metal catalysts 140a and 140b that pass through the capping layer 130 diffused by the annealing process 150 is diffused into the surface of the amorphous silicon layer 120, and most of the metal catalyst 140a does not reach the amorphous silicon layer 120 or does not pass through the capping layer 130.

Accordingly, the amount of the metal catalyst reaching the surface of the amorphous silicon layer 120 is determined by the diffusion suppression capability of the capping layer 130, and the diffusion suppression capability of the capping layer 130 has a close relation to the thickness of the capping layer 130. That is, the thicker the capping layer 130 is, the less the diffusion amount is so that the size of the crystal grain increases, and the thinner the capping layer is, the more the diffusion amount is so that the size of the crystal grain decreases.

The annealing process 150 is performed for several seconds to several hours at a temperature of 200 to 900° C. to diffuse the metal catalyst. The annealing time is limited in time and temperature so that deformation of the substrate from excessive annealing does not occur, and so that the annealing process is favorable in terms of manufacturing cost and yield. The annealing process 150 may be carried out by one of a furnace process, a rapid thermal annealing process, a UV process, and a laser process.

FIG. 1D is a cross-sectional view illustrating a process of crystallizing the amorphous silicon layer into the polycrystalline silicon layer using the diffused metal catalyst.

Referring to FIG. 1D, the amorphous silicon layer 120 is crystallized into a polycrystalline silicon layer 160 by the metal catalyst 140b that passes through the capping layer 130 and diffuses onto the surface of the amorphous silicon layer 120. That is, the diffused metal catalyst 140b combines with silicon of the amorphous silicon layer to form a metal silicide, and the metal silicide forms seeds, i.e., crystallization nuclei, so that during an additional annealing process, the amorphous silicon layer is crystallized into the polycrystalline silicon layer.

The annealing process to crystallize the amorphous silicon layer may be performed without removing the capping layer 130 and the metal catalyst layer 140 as shown in FIG. 1D. As an alternative, the capping layer 130 and the metal catalyst layer 140 may be removed and the annealing process may be performed to form the polycrystalline silicon layer after the metal catalyst has diffused onto the amorphous silicon layer 120 to form the metal silicide, i.e., crystallization nuclei.

FIGS. 2A to 2E are cross-sectional views illustrating a process of fabricating a TFT according to an embodiment of the present invention.

Referring to FIG. 2A, a semiconductor layer 210 is formed on the substrate 100 on which the buffer layer 110 is formed. The semiconductor layer 210 is formed by removing the capping layer (130 of FIG. 1D) and the metal catalyst layer (140 of FIG. 1D) and patterning the polycrystalline silicon layer (160 of FIG.1 D). Alternatively, the patterning of the polycrystalline silicon layer may be performed in a subsequent process.

Next, referring to FIG. 2B, a gate insulating layer 220 is formed on the substrate 100 and on the semiconductor layer 210. The gate insulating layer 220 may be a silicon oxide layer, a silicon nitride layer or a double layer thereof.

Next, a photoresist pattern 230 is formed in a region corresponding to a channel region of the semiconductor layer 210 on the gate insulating layer 220. A predetermined amount of conductive impurity ions 240 is implanted using the photoresist pattern 230 as a mask to form a source region 211, a drain region 213, and a channel region 212. P-type or n-type impurities may be used as the impurity ions 240 to form the TFT, wherein the p-type impurities may be selected from the group consisting of B, Al, Ga and In, and the n-type impurities may be selected from the group consisting of P, As and Sb.

Figure 2C:
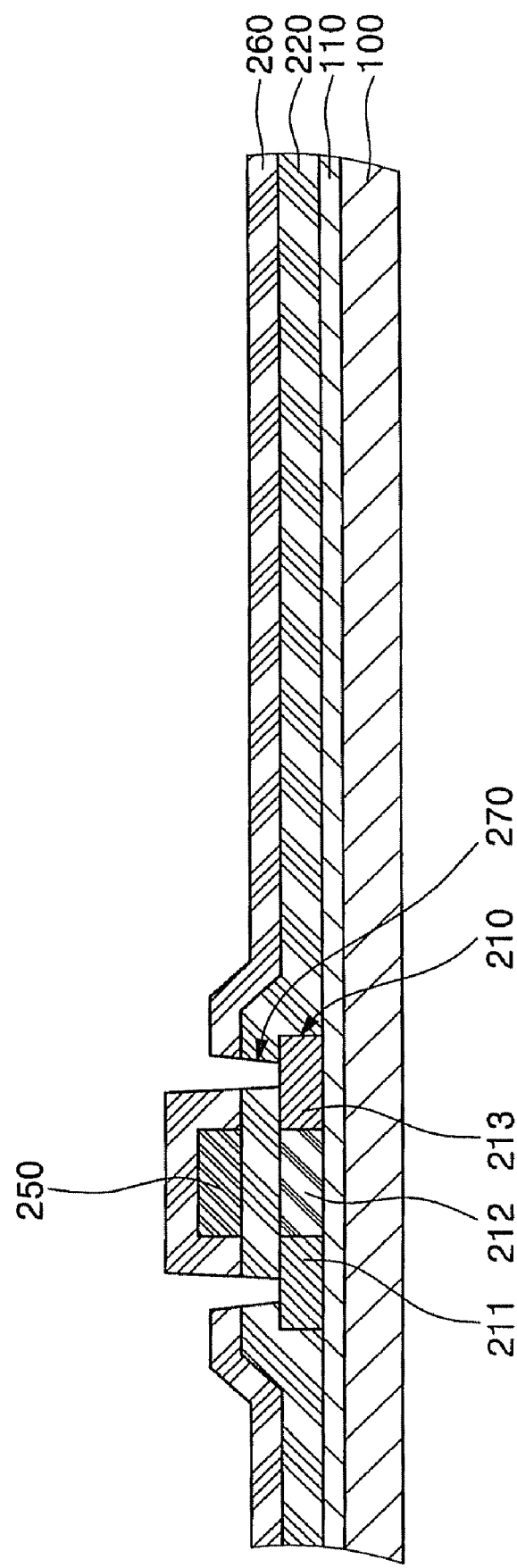

Next, referring to FIG. 2C, the photoresist pattern 230 is removed, a single layer of Al or an Al alloy such as Al—Nd, or a multiple layer of an Al alloy stacked on a Cr or Mo alloy is formed as a metal layer (not shown) for a gate electrode on the gate insulating layer 220, and the metal layer is etched by a photolithography process to form a gate electrode 250 in a region corresponding to the channel region 212 of the semiconductor layer 210.

An interlayer insulating layer 260 is then formed over the entire surface of the substrate 100 including the gate electrode 250. Here, the interlayer insulating layer 260 may be a silicon nitride layer, a silicon oxide layer or a multiple layer thereof.

The interlayer insulating layer 260 and the gate insulating layer 220 are then etched to form contact holes 270 exposing source and drain regions 211 and 213 of the semiconductor layer 210.

Figure 2D:
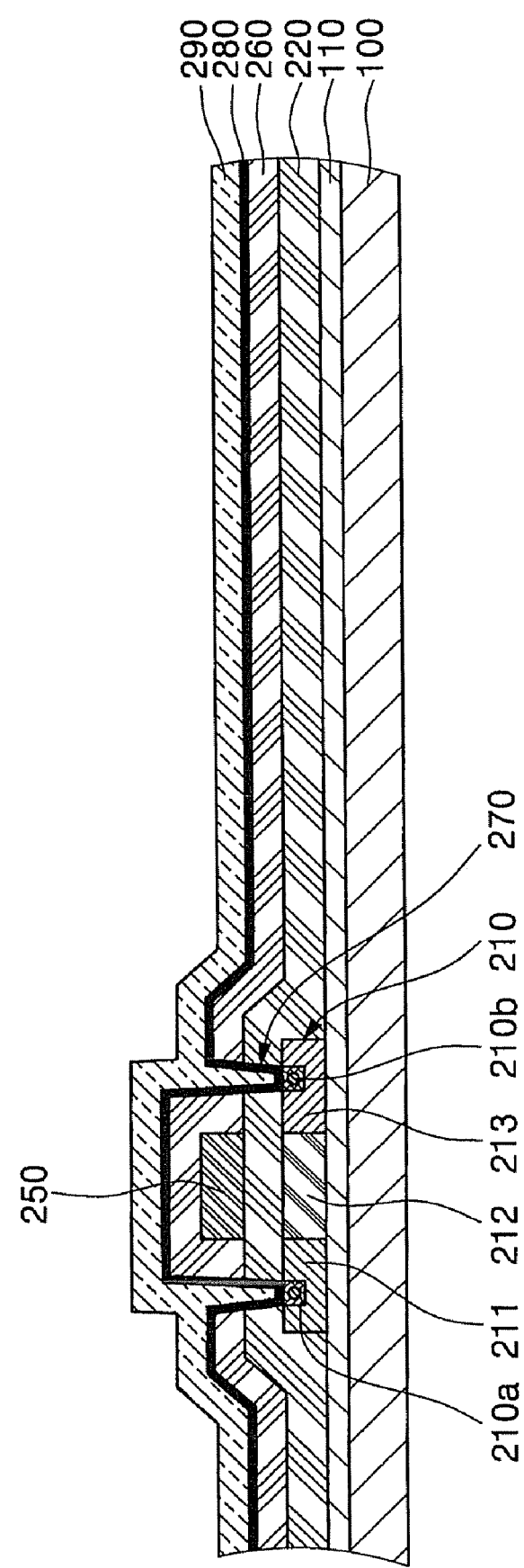

Next, referring to FIG. 2D, a metal layer, a metal silicide layer, or a double layer thereof 280 is formed on the interlayer insulating layer 260 in which the contact holes 270 are formed. According to aspects of the present invention, after the metal layer, the metal silicide layer, or the double layer thereof 280 is deposited, a gettering process is performed using a region within the semiconductor layer 210 to be formed by a subsequent annealing process.

The metal layer, the metal silicide layer, or the double layer thereof 280 may include a metal layer having a metal or alloy thereof with a diffusion coefficient smaller than the diffusion coefficient of the metal catalyst that is used for crystallization, or a metal silicide layer thereof within the semiconductor layer 210.

The diffusion coefficient of the metal or metal silicide of the metal layer, the metal silicide layer, or the double layer thereof 280 within the semiconductor layer 210 is preferably not greater than $1/100$ of the diffusion coefficient of the metal catalyst for crystallization. When the diffusion coefficient of the metal or metal silicide is not greater than $1/100$ of the metal catalyst, the metal or metal silicide for gettering can be prevented from migrating out of a region 210a in contact with the metal layer, the metal silicide layer, or the double layer thereof 280 within the semiconductor 210 to diffuse into other regions within the semiconductor layer 210 and into other regions within the semiconductor layer 210.

Nickel is widely employed as the metal catalyst for crystallization of the semiconductor layer. Nickel has a diffusion coefficient not greater than about $10^{-5}$ cm$^2$/s within the semiconductor layer. Therefore, the diffusion coefficient of the metal or metal silicide of the metal layer, the metal silicide layer, or the double layer thereof 280 should not be greater than $1/100$ of the diffusion coefficient of nickel, i.e., greater than 0 and not greater than $10^{-7}$ cm$^2$/s when the nickel is used as the metal catalyst. As non-limiting examples, the metal or metal silicide may include one selected from the group consisting of Sc, Ti, Zr, Hf, V, Nb, Ta, Cr, Mo, W, Mn, Re, Ru, Os, Co, Rh, Ir, Pt, Y, Ta, La, Ce, Pr, Nd, Dy, Ho, TiN, TaN, and an alloy thereof.

In addition, the metal layer, the metal silicide layer, or the double layer thereof 280 may have a thickness of 30 to 2000 Å. When the thickness is less than 30 Å, the gettering efficiency of the metal catalyst for crystallization into a region 210a within the semiconductor layer 210 in contact with the metal layer, the metal silicide layer, or the double layer thereof 280 may be decreased. When the thickness the metal layer, the metal silicide layer, or the double layer thereof 280 exceeds 2000 Å, the substrate 100 may be deformed because of thermal expansion of the metal layer, the metal silicide layer, or the double layer thereof 280 formed over the entire surface at the time of subsequent annealing for gettering.

Afterwards, a thermal oxidation barrier 290 may be formed on the metal layer, the metal silicide layer, or the double layer thereof 280. The thermal oxidation barrier 290 acts to prevent surface denaturation caused by oxidation of the metal layer, the metal silicide layer or the double layer thereof 280 or reaction between the metal layer, the metal silicide layer or the double layer thereof and a gas such as nitrogen depending on the annealing condition at the time of subsequent annealing for gettering, and may be formed of a silicon oxide layer or a silicon nitride layer. The forming of the thermal oxidation barrier 290 may be omitted when a subsequent annealing process is performed in an inactive atmosphere.

An annealing process is then performed to remove the metal catalyst for crystallization remaining in the semiconductor layer 210, particularly, the metal catalyst remaining in the channel region 212 of the semiconductor layer 210. When the annealing process is performed, the metal of the metal layer combines with silicon of the semiconductor layer 210 from the surface of the semiconductor layer 210 in contact with the metal layer, the metal silicide layer, or the double layer thereof 280 to form a metal silicide, or the metal silicide of the metal silicide layer is diffused into the region of the semiconductor layer 210. Accordingly, the region 210a in which a metal silicide different from the metal silicide formed from the metal catalyst for crystallization is present is formed in the region of the semiconductor layer 210 in contact with the metal layer, the metal silicide layer, or the double layer thereof 280. The region 210a of the semiconductor layer containing the metal silicide may extend from the surface of the semiconductor layer 210 in contact with the metal layer, the metal silicide layer, or the double layer thereof 280 to a predetermined depth. A portion of the metal in the metal layer, the metal silicide layer, or the double layer thereof 280 in contact with the semiconductor layer 210 may also be converted into the metal silicide layer.

When the metal catalyst for crystallization remaining in the channel region 212 of the semiconductor layer 210 diffuses into the region 210a within the semiconductor layer 210 in contact with the metal layer, the metal silicide layer, or the double layer thereof 280 by the annealing process, the metal catalyst precipitates in the region 210a so that it does not diffuse any more. This is because the metal catalyst for crystallization is thermodynamically more stable in the region 210a in which other metal silicides are present than in the silicon of the semiconductor layer 210. Therefore, according to this principle, the metal catalyst for crystallization remaining in the channel region 212 of the semiconductor layer 210 can be removed.

The annealing may be performed at a temperature of 500 to 993° C. for 10 seconds to 10 hours. When the temperature is less than 500° C., the metal catalyst for crystallization may not diffuse i into the region 210a within the semiconductor layer 210. When the temperature exceeds 993° C., nickel as the metal catalyst may be present in a solid state because the eutectic point of nickel is 993° C., and the substrate may be deformed because of the high temperature.

In addition, when the annealing time is less than 10 seconds, the metal catalyst remaining in the channel region 212 of the semiconductor layer 210 may not be sufficiently removed, and when the annealing time exceeds 10 hours, the substrate may be deformed because of the long time annealing and the manufacturing cost and yield of the TFT may be affected. Meanwhile, when the annealing is performed at a higher temperature, the metal catalysts can be removed even in a short time.

Meanwhile, in order to increase the gettering effect, n-type or p-type impurities may also be implanted into the region 210a of the semiconductor layer 210 in contact with the metal layer, the metal silicide layer, or the double layer thereof 280. At this time, the n-type impurities may be phosphorus (P) and the p-type impurities may be boron (B). Alternatively, in order to increase the gettering effect more, ions or plasma may be used to form a damage region 210b within the region 210a of the semiconductor layer 210 in contact with the metal layer, the metal silicide layer, or the double layer thereof 280.

Figure 2E:
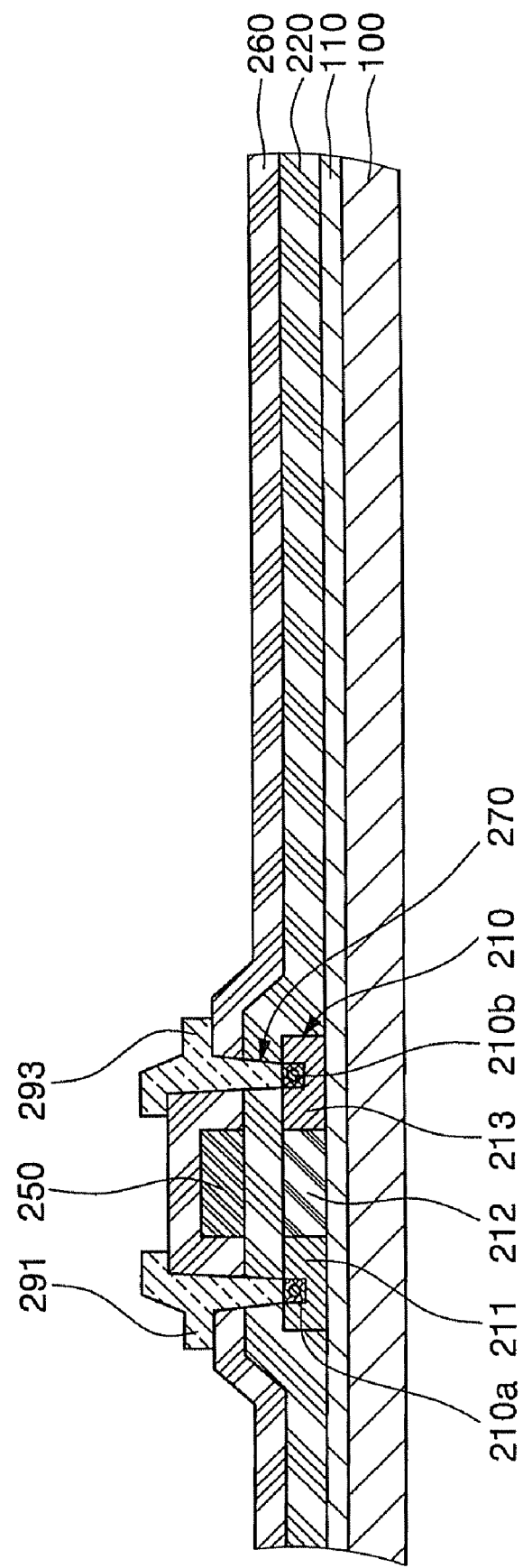

Next, referring to FIG. 2E, the metal layer, the metal silicide layer, or the double layer thereof 280, and the thermal oxidation barrier 290 are removed. Source and drain electrodes 291 and 293 are then formed to be connected to the source and drain regions 211 and 213, respectively, through the contact holes 270. The source and drain electrodes 291 and 293 may be formed of one selected from the group consisting of Mo, Cr, W, MoW, Al, Al—Nd, Ti, TiN, Cu, a Mo alloy, an Al alloy and a Cu alloy. Therefore, the TFT according to an embodiment of the present invention is completed.

Figure 3A:
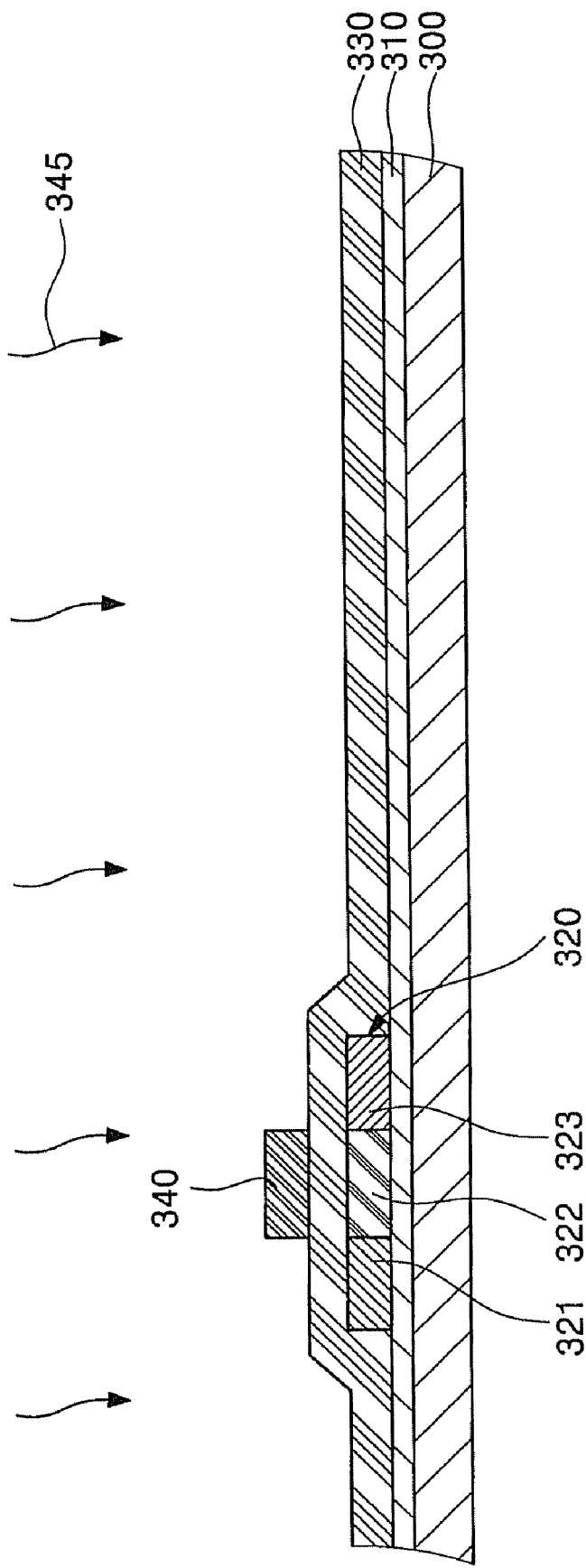
FIGS. 3A to 3C are cross-sectional views illustrating a process of fabricating a TFT according to another embodiment of the present invention.
Figure 3B:
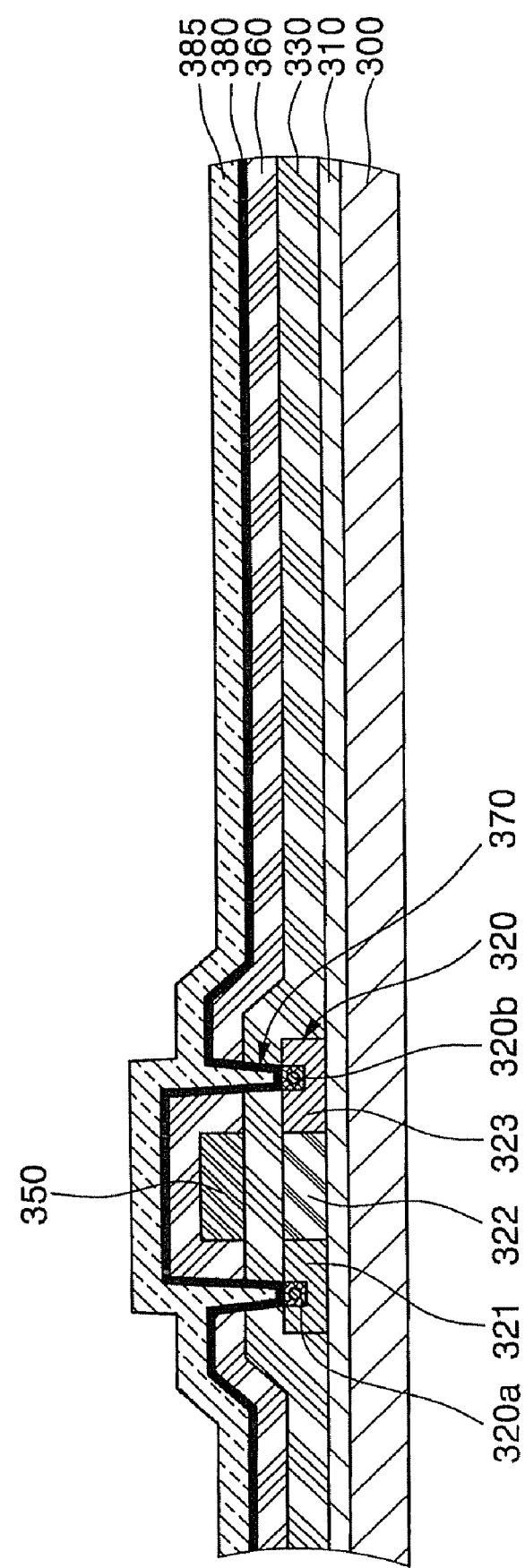
Figure 3C:
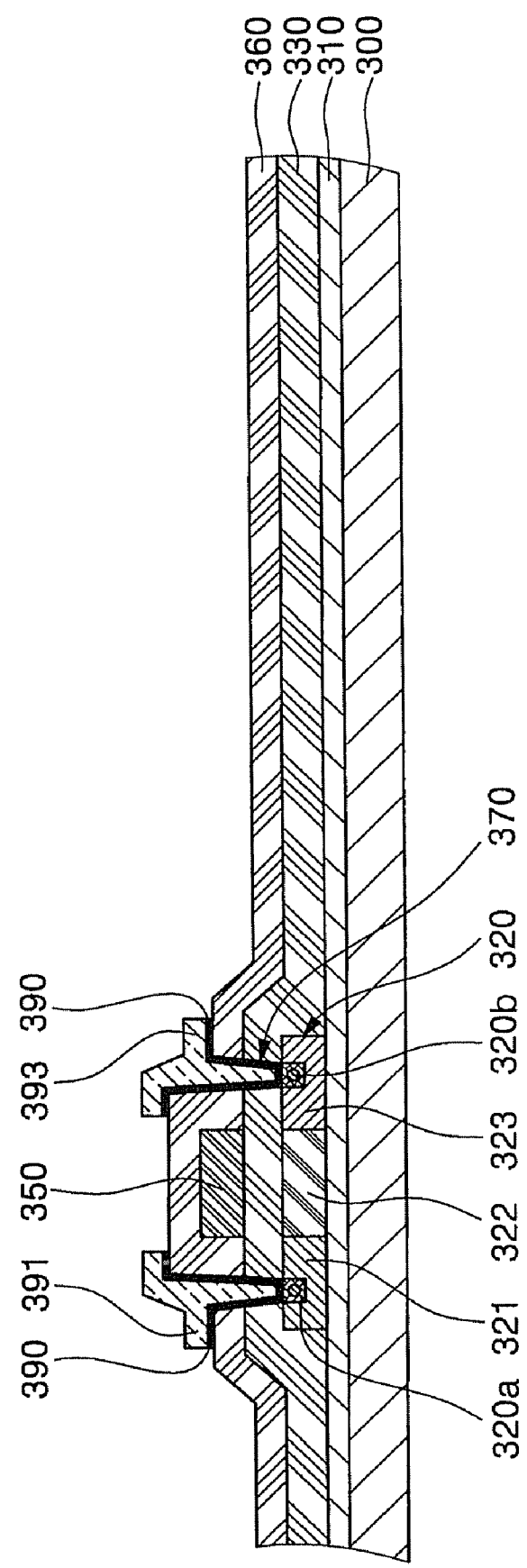

FIGS. 3A to 3C are cross-sectional views illustrating a process of fabricating a TFT according to another embodiment of the present invention. This embodiment is formed in the same manner as the embodiment shown in FIGS. 1A to 1D and 2A to 2E except for differences described below.

A substrate 300 on which a buffer layer 310 is formed is first prepared. An amorphous silicon layer is then formed on the buffer layer 310, which is crystallized into a polycrystalline silicon layer using a metal catalyst as described in the embodiment of FIGS. 1A to 1D. The polycrystalline silicon layer is patterned to form a semiconductor layer 320. Alternatively, the patterning of the polycrystalline silicon layer may be performed in a subsequent process.

A gate insulating layer 330 is then formed on the substrate 300 and on the semiconductor layer 320.

A photoresist pattern 340 is formed in a region corresponding to a channel region of the semiconductor layer 320 on the gate insulating layer 330. A predetermined amount of conductive impurity ions 345 is implanted using the photoresist pattern 340 as a mask to form a source region 321, a drain region 323, and a channel region 322.

Next, referring to FIG. 3B, the photoresist pattern 340 is removed, a metal layer (not shown) for a gate electrode is formed on the gate insulating layer 330, and the metal layer for a gate electrode is etched by a photolithography process to form a gate electrode 350 in a region corresponding to the channel region 322 of the semiconductor layer 320.

An interlayer insulating layer 360 is then formed over the entire surface of the substrate 300 including the gate electrode 350. The interlayer insulating layer 360 and the gate insulating layer 330 are then etched to form contact holes 370 exposing the source and drain regions 321 and 323 of the semiconductor layer 320.

A metal layer, a metal silicide layer, or a double layer thereof 380 is formed on the interlayer insulating layer 360 in which the contact holes 370 are formed. According to aspects of the present invention, a gettering process is performed using the region within the semiconductor layer 320 to be formed by a subsequent annealing process after the metal layer, the metal silicide layer, or the double layer thereof 380 is deposited. A thermal oxidation barrier 385 may be formed on the metal layer, the metal silicide layer, or the double layer thereof 380.

An annealing process is then performed to remove the metal catalyst for crystallization remaining in the semiconductor layer 320, particularly, remaining in the channel region 322 of the semiconductor layer 320. When the annealing process is performed, the metal of the metal layer combines with silicon of the semiconductor layer 320 from the surface of the semiconductor layer 320 in contact with the metal layer, the metal silicide layer, or the double layer thereof 380 to form a metal silicide, and/or a metal silicide of the metal silicide layer is diffused into the region of the semiconductor layer 320. Accordingly, a region 320a, in which a metal silicide different from the metal silicide formed from the metal catalyst for crystallization is present, is formed in the region of the semiconductor layer 320 in contact with the metal layer, the metal silicide layer, or the double layer thereof 380. The region 320a of the semiconductor layer 320 containing the metal silicide may extend from the surface of the semiconductor layer 320 in contact with the metal layer, the metal silicide layer, or the double layer thereof 380 to a predetermined depth.

When the metal catalysts for crystallization remaining in the channel region 322 of the semiconductor layer 320 diffuses into the region 320a within the semiconductor layer 320 in contact with the metal layer, the metal silicide layer, or the double layer thereof 380 by the annealing process, the metal catalyst precipitates in the region 320a so that it does not diffuse any more.

In order to increase the gettering effect, n-type or p-type impurities may also be implanted into the region 320a of the semiconductor layer 320 in contact with the metal layer, the metal silicide layer, or the double layer thereof 380, and ions or plasma may be used to form a damage region 320b in order to increase the gettering effect more.

Next, referring to FIG. 3C, the thermal oxidation barrier 385 is removed. A material for source and drain electrodes is then deposited on the metal layer, the metal silicide layer, or the double layer thereof 380. The metal layer, the metal silicide layer, or the double layer thereof 380, and the material for source and drain electrodes are patterned to form a patterned metal layer, metal silicide layer, or a double layer thereof 390, and source and drain electrodes 391 and 393. Unlike the first embodiment, the metal layer, the metal silicide layer, or the double layer thereof 380 is not removed but instead is patterned to form the patterned metal layer, metal silicide layer or the double layer thereof 390. The source and drain electrodes 391 and 393 are electrically connected to the source and drain regions 321 and 323, respectively, of the semiconductor layer 320 through the patterned metal layer, the metal silicide layer, or the double layer thereof 390 in the second embodiment of the present invention. Therefore, the TFT according to the embodiment of FIGS. 3A to 3C is completed.

Figure 4C:
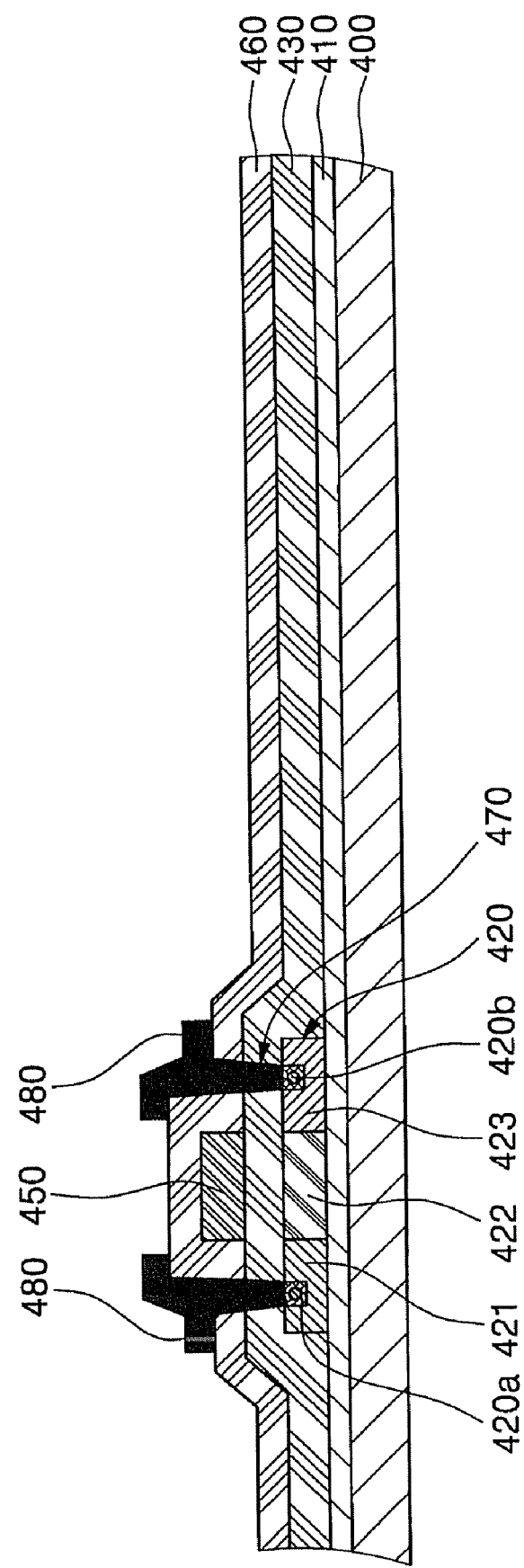

FIGS. 4A to 4C are cross-sectional views illustrating a process of fabricating a TFT according to another embodiment of the present invention. This embodiment is formed in the same manner as the above-described embodiments except for differences described below.

A substrate 400 in which a buffer layer 410 is formed is first prepared. An amorphous silicon layer is then formed on the buffer layer 410 and is crystallized into a polycrystalline silicon layer using a metal catalyst as described in the embodiment of FIGS. 1A to 1D. The polycrystalline silicon layer is patterned to form a semiconductor layer 420. Alternatively, the patterning of the the polycrystalline silicon layer may be performed in a subsequent process.

A gate insulating layer 430 is then formed on the substrate 400 and on the semiconductor layer 420. A photoresist pattern (not shown) is formed in a region corresponding to a channel region of the semiconductor layer 420 on the gate insulating layer 430, and a predetermined amount of conductive impurity ions is implanted using the photoresist pattern as a mask to form a source region 421, a drain region 423, and a channel region 422.

Then, the photoresist pattern is removed, a metal layer (not shown) for a gate electrode is formed on the gate insulating layer 430, and the metal layer for a gate electrode is etched by a photolithography process to form a gate electrode 450 in a region corresponding to the channel region 422 of the semiconductor layer 420.

Next, referring to FIG. 4B, an interlayer insulating layer 460 is formed over the entire surface of the substrate 400 including the gate electrode 450. The interlayer insulating layer 460 and the gate insulating layer 430 are then etched to form contact holes 470 exposing the source and drain regions 421 and 423 of the semiconductor layer 420.

A metal layer, a metal silicide layer, or a double layer thereof is then formed on the interlayer insulating layer 460 in which the contact holes 470 are formed, and is patterned to form a patterned metal layer, metal silicide layer, or a double layer thereof 480. The metal layer, the metal silicide layer, or the double layer thereof has a thickness of 30 to 10000 Å, unlike the metal layer, the metal silicide layer, or the double layer thereof 380 of the embodiment of FIGS. 3A to 3C.

Unlike the metal layer, the metal silicide layer, or the double layer thereof described in the previous embodiments, the metal layer, the metal silicide layer, or the double layer thereof in the present embodiment is first patterned and then annealing is performed for gettering so that the metal layer, the metal silicide layer, or the double layer thereof is not present over the entire surface of the substrate 400 at the time of annealing. Accordingly, deformation of the substrate 400 at the time of annealing, which can be caused by the thermal expansion of the metal layer, the metal silicide layer, or the double layer thereof formed over the entire surface can be avoided, so that the patterned metal layer, metal silicide layer, or double layer thereof 480 can be formed up to a thickness of 10000 Å.

Afterwards, a thermal oxidation barrier 490 may be formed on the patterned metal layer, the metal silicide layer, or the double layer thereof 480. An annealing process is then performed to remove the metal catalyst for crystallization remaining in the semiconductor layer 420, particularly, the metal catalyst remaining in the channel region 422 of the semiconductor layer 420. When the annealing process is performed, a metal of the metal layer combines with silicon of the semiconductor layer 420 at the surface of the semiconductor layer 420 in contact with the metal layer pattern, the metal silicide layer pattern, or the double layer pattern thereof 480 to form a metal silicide, and/or the metal silicide of the metal silicide layer pattern is diffused into the region of the semiconductor layer 420 in contact with the patterned metal layer, metal silicide layer, or double layer thereof 480. Accordingly, a region 420a, in which a metal silicide different from the metal silicide formed from the metal catalyst for crystallization is present, is formed in the region of the semiconductor layer 420 in contact with the patterned metal layer, metal silicide layer, or the double layer thereof 480. The region 420a of the semiconductor layer 420 containing the metal silicide may extend from the surface of the semiconductor layer 420 in contact with the patterned metal layer, metal silicide layer, or double layer thereof 480 to a predetermined depth.

When the metal catalyst for crystallization remaining in the channel region 422 of the semiconductor layer 420 diffuses into the region 420a within the semiconductor layer 420 in contact with the patterned metal layer, metal silicide layer, or double layer thereof 480 by the annealing process, the metal catalyst precipitates in the region 420a so that it does not diffuse any more.

In order to increase the gettering effect, n-type or p-type impurities may also be implanted into the region 420a of the semiconductor layer 420 in contact with the patterned metal layer, metal silicide layer, or the double layer thereof 480, and ions or plasma may be used to form a damage region 420b in order to increase the gettering effect.

Next, referring to FIG. 4C, the thermal oxidation barrier 490 is removed. Therefore, the TFT according to the embodiment of FIGS. 4A to 4C is completed, wherein the patterned metal layer, metal silicide layer, or double layer thereof 480 becomes source and drain electrodes. When the patterned metal layer, metal silicide layer, or double layer thereof 480 becomes the source and drain electrodes as in the embodiment of FIGS. 4A to 4C, a separate material for source and drain electrodes does not need to be formed, so that the process can be more simplified.

FIG. 5 is a graph in which the off-current per unit width of the semiconductor layer of a TFT formed by a conventional gettering method using phosphorous (P) doping is compared with the off-current per unit width of the semiconductor layer of TFTs according to embodiments of the present invention. Region A in the horizontal axis indicates the TFT formed by the conventional gettering method using P doping, regions B and C indicate TFTs formed according to embodiments of the present invention, wherein region B indicates a TFT formed using Ti and region C indicates a TFT formed using Mo. The vertical axis indicates the measured off-current (A/μm) per unit width of the semiconductor layer of the TFT.

In the TFT formed by the conventional gettering method using P doping, P was doped at a dose of $2*e^{14}/cm^2$ into the region exposed by the contact hole in the semiconductor layer crystallized using Ni as the metal catalyst for crystallization, and then annealing was performed for one hour at 550° C. In the TFTs according to the embodiments of the present invention, a 100 Å thick layer of Ti or Mo was deposited on the regions exposed by the contact holes in the respective semiconductor layers crystallized using Ni as the metal catalyst, and the annealing was performed in the same gettering conditions as the gettering conditions using P doping. The off-current of each TFT was measured after the annealing was performed.

When Ti or Mo is deposited and the annealing for gettering is performed in accordance with the embodiments of the present invention, Ti or Mo reacts with Si of the semiconductor layer to form Ti silicide or Mo silicide. A region in which the Ti or Mo silicide is formed extends from the interface of the semiconductor layer and the Ti or Mo layer to a depth within the semiconductor layer, and the metal catalyst (for example, Ni in the particular examples described above) is gettered into the region in which the Ti or Mo silicide is formed.

Referring to region A of FIG. 5, the off-current per unit width of the semiconductor layer of the TFT formed by the conventional gettering method using P doping was measured four times. As a result, values in the range of about $4.5E^{-12}$ to $7.0E^{-12}$ A/μm were measured. In contrast, referring to regions B and C of FIG. 5, it can be seen that the off-currents per unit width of the semiconductor layer of the TFT according to the embodiments of the present invention were $5.0E^{-13}$ A/μm or less in the case of the TFT formed using Ti and $6.0E^{-13}$ A/μm or less in the case of the TFT formed using Mo, demonstrating that the off-current per unit width of the semiconductor layer formed according to aspects of the present invention was significantly reduced over the semiconductor layer formed using the conventional method.

Therefore, based on the results mentioned above, it can be concluded from the significantly reduced off-current values that the amount of metal catalyst remaining in the channel region of the semiconductor layer is also significantly reduced. Therefore, a TFT having good electrical characteristics with a significantly reduced leakage current can be provided according to the embodiments of the present invention.

Figure 6:
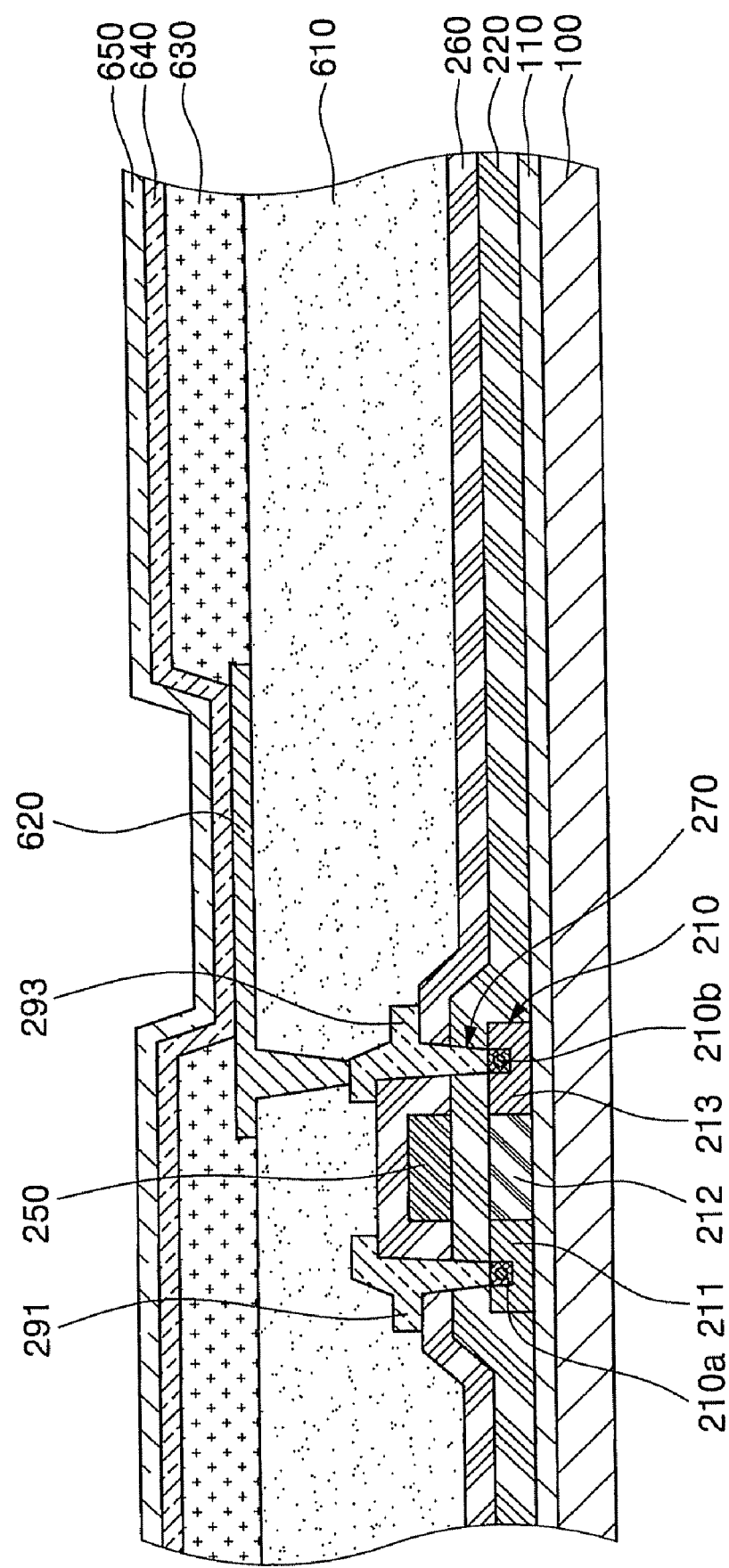
FIG. 6 is a cross-sectional view of an OLED display device including the TFT illustrated in FIG. 2E.

FIG. 6 is a cross-sectional view of an OLED display device including a TFT according to another embodiment of the present invention. Referring to FIG. 6, an insulating layer 610 is formed over the entire surface of the substrate 200 including the TFT of FIG. 2E. The insulating layer 610 may be an inorganic layer selected from the group consisting of i a silicon oxide layer, a silicon nitride layer and spin on glass, or may be an organic layer selected from the group consisting of polyimide, benzocyclobutene series resin and acrylate. Alternatively, the insulating layer 610 may have a stacked structure of the inorganic layers and the organic layers.

The insulating layer 610 is etched to form a via hole exposing the source electrode 291 or the drain electrode 293. A first electrode 620 is formed to be connected to one of the source and drain electrodes 291 and 293 through the via hole. The first electrode 620 may be an anode or a cathode. When the first electrode 620 is an anode, the anode may be formed of a transparent conductive layer formed of one of indium tin oxide (ITO), indium zinc oxide (IZO) and indium tin zinc oxide (ITZO). When the first electrode is a cathode, the cathode may be formed of Mg, Ca, Al, Ag, Ba, or an alloy thereof.

Subsequently, a pixel-defining layer 630 having an opening that exposes a portion of the surface of the first electrode 620 is formed on the first electrode 620, and an organic layer 640 including an emitting layer is formed on the exposed first electrode 620. The organic layer 640 may further include at least one selected from the group consisting of a hole injection layer, a hole transport layer, a hole blocking layer, an electron blocking layer, an electron injection layer and an electron transport layer. A second electrode 650 is then formed on the organic layer 640. Therefore, the OLED display device according to an embodiment of the present invention is completed.

In a semiconductor layer formed of a polycrystalline silicon layer crystallized using a metal catalyst, a metal layer including a metal having a diffusion coefficient smaller than the metal catalyst for crystallization or an alloy thereof within the semiconductor layer, a metal silicide layer, or a double layer thereof is formed and annealed in a region of the semiconductor layer exposed by a contact hole, so that the metal catalyst remaining in the channel region of the semiconductor layer can be removed, thereby significantly reducing the off-current of the TFT. In addition, the metal layer, the metal silicide layer, or the double layer thereof can be patterned to be used as source and drain electrodes, so that the process of making a TFT can be simplified.

According to aspects of the present invention as described above, metal catalysts remaining in a channel region of a semiconductor layer are removed, so that a TFT having good electrical characteristics with a reduced leakage current or the like, a method of fabricating the same, and an OLED display device having the same can be obtained.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting diode (OLED) display device comprising:
a substrate;
a semiconductor layer disposed on the substrate and crystallized using a metal catalyst;
a gate insulating layer disposed on a surface of the semiconductor layer;
a gate electrode disposed on the gate insulating layer;
an interlayer insulating layer disposed on the gate electrode; and
source and drain electrodes disposed on the interlayer insulating layer and electrically connected to source and drain regions, respectively, of the semiconductor layer through contact holes and exposing predetermined regions of the source and drain regions of the semiconductor layer formed within the gate insulating layer and the interlayer insulating layer;
a first electrode electrically connected to one of the source and drain electrodes;
an organic layer including an emitting layer disposed on the first electrode; and
a second electrode disposed on the organic layer,
wherein a metal silicide comprising a metal that is different from the metal catalyst is present within a region of the semiconductor layer under each contact hole, from the surface of the semiconductor layer to a predetermined depth, and
the metal catalyst from a channel region of the semiconductor layer is gettered into the regions of the semiconductor layer disposed under each contact hole.

2. A thin film transistor (TFT) comprising:
a substrate;
a semiconductor layer disposed on the substrate and crystallized using a metal catalyst;
a gate insulating layer disposed on a surface of the semiconductor layer;
a gate electrode disposed on the gate insulating layer;
an interlayer insulating layer disposed on the gate electrode; and
source and drain electrodes disposed on the interlayer insulating layer and electrically connected to source and drain regions, respectively, of the semiconductor layer through contact holes exposing predetermined regions of the source and drain regions of the semiconductor layer and formed within the gate insulating layer and the interlayer insulating layer,
wherein a metal silicide comprising a metal that is different from the metal catalyst is present within a region of the semiconductor layer under each contact hole, from the surface of the semiconductor layer to a predetermined depth, and
the metal catalyst from a channel region of the semiconductor layer is gettered into the regions of the semiconductor layer disposed under each contact hole.

3. The TFT according to claim 2, wherein the metal silicide has a smaller diffusion coefficient than the metal catalyst within the semiconductor layer.

4. The TFT according to claim 3, wherein the diffusion coefficient of the metal silicide is not greater than $1/100$ of the diffusion coefficient of the metal catalyst.

5. The TFT according to claim 4, wherein the metal catalyst is nickel, and the diffusion coefficient of the metal silicide is greater than 0 and is not greater than $10^{-7} cm^2/s$.

6. The TFT according to claim 3, wherein the metal silicide comprises one selected from the group consisting of Sc, Ti, Zr, Hf, V, Nb, Ta, Cr, Mo, W, Mn, Re, Ru, Os, Co, Rh, Ir, Pt, Y, Ta, La, Ce, Pr, Nd, Dy, Ho, TiN, TaN, and an alloy thereof.

7. The TFT according to claim 2, wherein the semiconductor layer is crystallized by a super grain silicon (SGS) crystallization method.

8. The TFT according to claim 2, further comprising:
a patterned metal layer including the metal of the metal silicide, a patterned metal silicide layer including the metal silicide, or a patterned double layer pattern thereof, which is disposed between the source and drain electrodes and the semiconductor layer in contact with the source and drain electrodes.

9. The TFT according to claim 8, wherein the patterned metal layer, the patterned metal silicide layer, or the patterned double layer thereof has a thickness of 30 to 10000 Å.

10. The TFT according to claim 2, wherein the source and drain electrodes comprise a patterned metal layer formed of the metal of the metal silicide, a patterned metal silicide layer formed of the metal silicide, or a patterned double layer thereof.

11. The TFT according to claim 10, wherein the patterned metal layer pattern, the patterned metal silicide layer, or the patterned double layer thereof has a thickness of 30 to 10000 Å.

12. The TFT according to claim 2, further comprising:
n-type or p-type impurities or a damage region formed by ion or plasma processing within the region of the semiconductor layer in which the metal silicide is present.

13. The TFT according to claim 2, wherein the TFT is formed by a method comprising:
preparing the substrate;
forming an amorphous silicon layer on the substrate;
crystallizing the amorphous silicon layer into a polycrystalline silicon layer using the metal catalyst;
patterning the polycrystalline silicon layer to form the semiconductor layer;
forming the gate insulating layer on the semiconductor layer;
forming the gate electrode on the gate insulating layer;
forming the interlayer insulating layer over the entire surface of the substrate including the gate electrode;
etching the gate insulating layer and the interlayer insulating layer to form the contact holes exposing the source and drain regions of the semiconductor layer;
forming a metal layer, a metal silicide layer, or a double layer thereof on the interlayer insulating layer in which the contact holes are formed; and
annealing the substrate to getter the metal catalyst present in a channel region of the semiconductor layer into regions of the semiconductor layer in contact with the metal layer, the metal silicide layer, or the double layer thereof.

14. The TFT according to claim 13, wherein the metal layer, the metal silicide layer, or the double layer thereof comprises a metal layer having a metal or alloy thereof with a smaller diffusion coefficient than the metal catalyst, or a metal silicide layer including a silicide metal or alloy thereof with a smaller diffusion coefficient than the metal catalyst within the semiconductor layer.

15. The TFT according to claim 14, wherein the diffusion coefficient of the metal layer, the metal silicide layer, or the double layer thereof is not greater than 1/100 of the diffusion coefficient of the metal catalyst.

16. The TFT according to claim 15, wherein the metal catalyst is nickel, and the diffusion coefficient of the metal layer, the metal silicide layer, or the double layer thereof is greater than 0 and is not greater than $10^{-7} cm^2/s$.

17. The TFT according to claim 15, wherein the metal layer, the metal silicide layer, or the double layer thereof comprises one selected from the group consisting of Sc, Ti, Zr, Hf, V, Nb, Ta, Cr, Mo, W, Mn, Re, Ru, Os, Co, Rh, Ir, Pt, Y, Ta, La, Ce, Pr, Nd, Dy, Ho, TiN, TaN, and an alloy thereof.

18. The TFT according to claim 13, wherein the annealing is performed for 10 seconds to 10 hours at a temperature of 500 to 993° C.

19. The TFT according to claim 13, wherein the crystallizing of the amorphous silicon layer is performed using a super grain silicon (SGS) crystallization method.

20. The TFT according to claim 13, further comprising:
forming a thermal oxidation barrier on the metal layer, the metal silicide layer, or the double layer thereof before annealing the substrate.

21. The TFT according to claim 20, further comprising:
removing the thermal oxidation barrier after annealing the substrate;
forming a material for source and drain electrodes on the metal layer, the metal silicide layer or the double layer thereof; and
patterning the metal layer, the metal silicide layer or the double layer thereof, and the material for source and drain electrodes.

22. The TFT according to claim 20, further comprising:
removing the thermal oxidation barrier after annealing the substrate; and
patterning the metal layer, the metal silicide layer or the double layer thereof to form source and drain electrodes.

23. The TFT according to claim 13, further comprising:
after gettering the metal catalyst, removing the metal layer, the metal silicide layer or the double layer thereof and forming source and drain electrodes in contact with the source and drain regions of the semiconductor layer on the interlayer insulating layer.

24. The TFT according to claim 13, further comprising:
implanting n-type or p-type impurities into the regions of the semiconductor layer in contact with the metal layer, the metal silicide layer or the double layer thereof, or forming a damage region using ions or plasma.

25. The TFT according to claim 13, further comprising:
after forming the metal layer, the metal silicide layer or the double layer thereof and before annealing the substrate, patterning the metal layer, the metal silicide layer or the double layer thereof to form source and drain electrodes.

26. The TFT according to claim 1, wherein the TFT is formed by a method comprising:
crystallizing an amorphous silicon layer into a polycrystalline silicon layer using a metal catalyst;
patterning the polycrystalline silicon layer to form a semiconductor layer;
forming at least one insulating layer on the semiconductor layer;
etching the at least one insulating layer to form contact holes exposing source and drain regions of the semiconductor layer;
forming a metal layer, a metal silicide layer, or a double layer thereof on the at least one insulating layer in which the contact holes are formed; and
annealing the substrate to getter the metal catalyst present in a channel region of the semiconductor layer into regions of the semiconductor layer in contact with the metal layer, the metal silicide layer, or the double layer thereof.

* * * * *

UNITED STATES PATENT AND TRADEMARK OFFICE
CERTIFICATE OF CORRECTION

| | | |
|---|---|---|
| PATENT NO. | : 8,283,668 B2 | Page 1 of 1 |
| APPLICATION NO. | : 12/194730 | |
| DATED | : October 9, 2012 | |
| INVENTOR(S) | : Park | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 456 days.

Signed and Sealed this
Second Day of September, 2014

Michelle K. Lee
*Deputy Director of the United States Patent and Trademark Office*